US012230593B2

(12) United States Patent
Chen et al.

(10) Patent No.: US 12,230,593 B2
(45) Date of Patent: Feb. 18, 2025

(54) WAFER LEVEL PACKAGE WITH POLYMER LAYER DELAMINATION PREVENTION DESIGN AND METHOD OF FORMING THE SAME

(71) Applicant: Taiwan Semiconductor Manufacturing Company, Ltd., Hsinchu (TW)

(72) Inventors: Kai-Heng Chen, New Taipei (TW); Pei-Haw Tsao, Tai-chung (TW); Shyue-Ter Leu, Hsinchu (TW); Rung-De Wang, Taoyuan (TW); Chien-Chun Wang, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 637 days.

(21) Appl. No.: 17/389,610

(22) Filed: Jul. 30, 2021

(65) Prior Publication Data

US 2023/0036317 A1  Feb. 2, 2023

(51) Int. Cl.
*H01L 23/48* (2006.01)
*H01L 21/56* (2006.01)
(Continued)

(52) U.S. Cl.
CPC .............. *H01L 24/02* (2013.01); *H01L 21/56* (2013.01); *H01L 23/3192* (2013.01); *H01L 23/562* (2013.01); *H01L 23/585* (2013.01); *H01L 24/04* (2013.01); *H01L 24/05* (2013.01); *H01L 2224/02126* (2013.01);
(Continued)

(58) Field of Classification Search
CPC ....... H01L 23/562–585; H01L 23/3192; H01L 24/02–50; H01L 2224/0401–05569; H01L 2224/02126–02381
See application file for complete search history.

(56) References Cited

U.S. PATENT DOCUMENTS 9,627,332 B1  4/2017  Liang et al.
9,780,046 B2  10/2017  Pan et al.
(Continued)

FOREIGN PATENT DOCUMENTS

TW  201724361 A  7/2017
TW  201740513 A  11/2017

OTHER PUBLICATIONS

Chinese language office action dated Nov. 14, 2022, issued in application No. TW 111112966.

*Primary Examiner* — Hoa B Trinh
(74) *Attorney, Agent, or Firm* — McClure, Qualey & Rodack, LLP

(57) ABSTRACT

A package structure is provided, including a substrate, a first passivation layer, a metallization layer, a second passivation layer, and a polymer layer. The first passivation layer is formed over the substrate. The metallization layer is conformally formed on the first passivation layer. The second passivation layer is conformally formed on the first passivation layer and the metallization layer. A step structure is formed on the top surface of the second passivation layer, and includes at least one lower part that is lower than the other parts of the step structure. The polymer layer is formed over the second passivation layer. A portion of the polymer layer extends into the lower part of the step structure to engage with the step structure.

20 Claims, 4 Drawing Sheets

(51) Int. Cl.
*H01L 23/00* (2006.01)
*H01L 23/31* (2006.01)
*H01L 23/58* (2006.01)

(52) U.S. Cl.
CPC ............. *H01L 2224/0214* (2013.01); *H01L 2224/02141* (2013.01); *H01L 2224/02255* (2013.01); *H01L 2224/02381* (2013.01); *H01L 2224/0401* (2013.01); *H01L 2224/05569* (2013.01)

(56) References Cited

U.S. PATENT DOCUMENTS

| | | |
|---|---|---|
| 10,522,488 B1 * | 12/2019 | Chen ................. H01L 24/16 |
| 2012/0104541 A1 | 5/2012 | Chiu |
| 2017/0141052 A1 * | 5/2017 | Pan ................. H01L 23/564 |
| 2020/0152543 A1 * | 5/2020 | Lin ................. H01L 24/14 |

* cited by examiner

WAFER LEVEL PACKAGE WITH POLYMER LAYER DELAMINATION PREVENTION DESIGN AND METHOD OF FORMING THE SAME

BACKGROUND

The semiconductor industry continues to improve the integration density of various electronic components (e.g., transistors, diodes, resistors, capacitors, etc.) by continual reductions in minimum feature size, which allow more components to be integrated into a given area. As the demand for even smaller electronic devices has grown, there has grown a need for smaller and more creative packaging technologies of semiconductor dies.

Conventional packaging technologies divide a wafer into separate dies and package each individual die, following a sequence of placing a single die on the package substrate, forming first-level interconnects generally via wire bond or flip chip, encapsulation, test, inspection, and second level interconnect to the circuit board in final assembly. These technologies and processes are time consuming.

Wafer level package (WLP) technology is the technology of packaging dies at wafer level. WLP technology can produce dies with small dimensions and good electrical properties, and is currently widely used for its low cost and relatively simple processes. WLP technology basically includes device interconnection and device protection processes. In WLP technology, back-end-of-line (BEOL) processes involve a few mask layers beginning with a polymer dielectric layer, a redistribution layer, an under bump metallization, and wafer bumping all prior to dicing.

Although existing WLP technologies have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

7 DETAILED DESCRIPTION

Figure 1B:
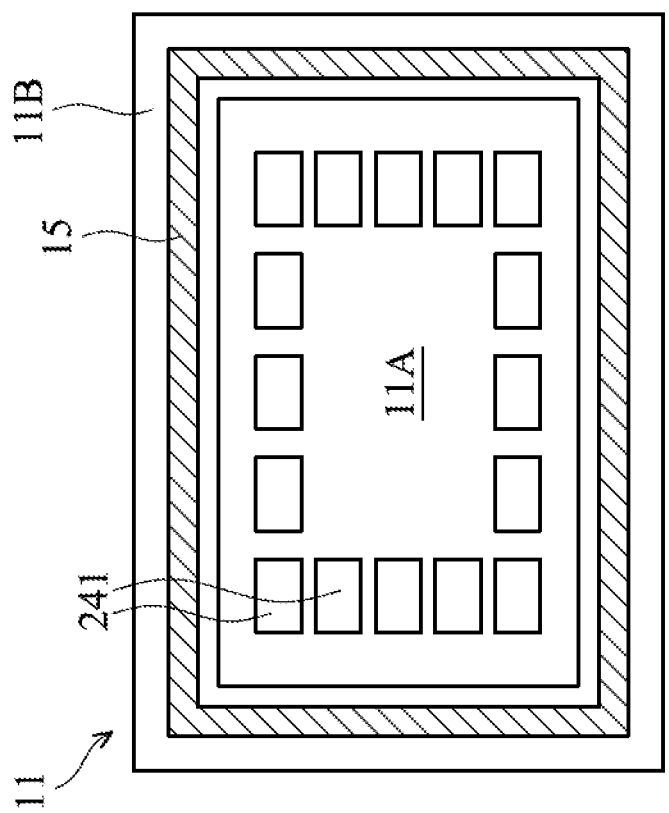
FIGS. 1A-1B are top views of a wafer level package (WLP) including multiple dies covered by a molding compound, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g., a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

A semiconductor device package (structure) and the method of forming the same are provided in accordance with various exemplary embodiments of the disclosure. The variations of the embodiments are discussed. Throughout the various views and illustrative embodiments, like reference numbers are used to designate like elements. In accordance with some embodiments, a package structure has a polymer layer delamination prevention design to increase the adhesion between the polymer layer and the underlying structure. Accordingly, the reliability of the package structure is improved.

Embodiments will be described with respect to a specific context, namely a wafer level package (WLP) technology. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. Further, method embodiments discussed herein may be discussed as being performed in a particular order; however, other method embodiments may also be performed in any logical order.

Figure 1A:
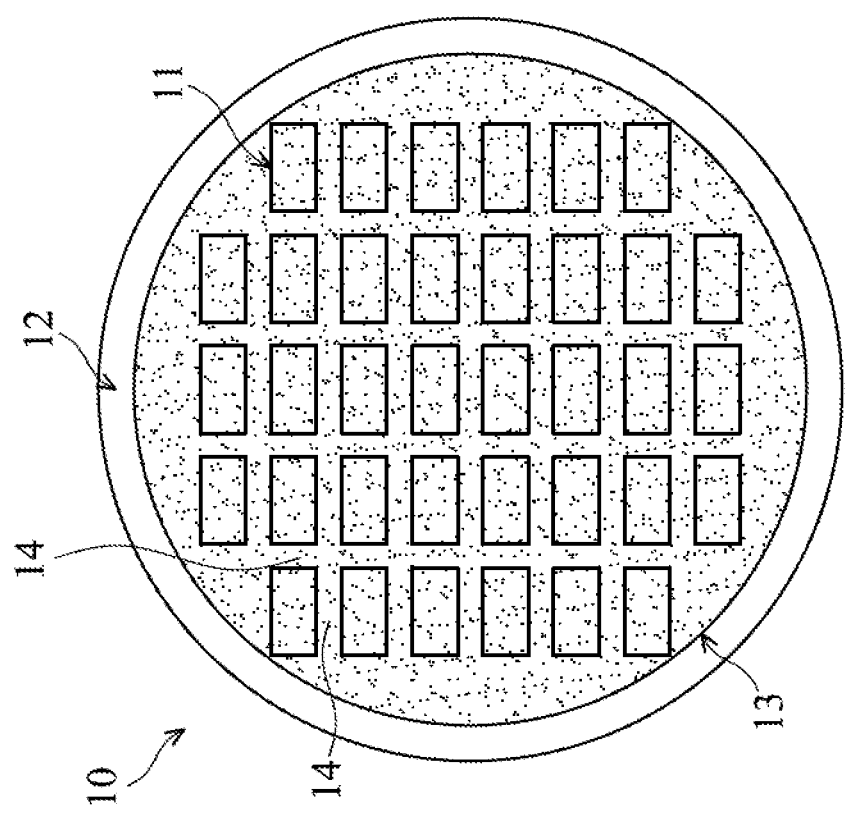

FIG. 1A illustrates a top view of a wafer level package (WLP) 10 including multiple dies 11 fabricated on a wafer 12 and covered by a molding compound 13, in accordance with some embodiments. More details of a die 11 are shown in FIG. 1B.

The WLP 10 may be a wafer level chip scale package (WLCSP), a fan-out wafer level package (FO-WLP), an embedded wafer level package (embedded WLP), a three-dimensional wafer level package (3D WLP), or a wafer level MEMS (WLP MEMS). The WLP 10 may be any other WLP package developed in various other technologies and for various applications.

Each of the dies 11 may be a chip made with various technologies, such as a CMOS chip, a GaAs chip, a SiGe chip, or an integrated passive device (IPD). The die 11 may be used to perform any function, such as a processor, a memory chip, a power amplifier, an optoelectronic device such as an image sensor, an A/D converter, or the like.

The WLP 10 includes a plurality of dies 11 identical to each other formed on a wafer 12, which are separated by scribe lines 14. The wafer 12 is used as a carrier for fabrication during the production of dies 11. After the semiconductor fabrication processes are complete, a plurality of dies 11 have been formed. The fabrication processes for the dies 11 are well known in the art and therefore not described herein. These dies 11 are later separated through a die cutting or singulation process in which a mechanical or laser saw is used to cut through the wafer 12 between individual dies 11. To facilitate the die cutting process, relatively narrow scribe lines 14 are provided on the wafer 12 along which the cuts are made to separate the dies 11. Each of the scribed lines 14 may be an area located between two dies 11. Scribed lines 14 surrounds the edges of the die 11.

The molding compound 13 covers the top of the dies 11 and the scribe lines 14. In some embodiments, the molding compound 13 is an insulating material, such as an epoxy-based resin with fillers dispersed therein. The molding compound 13 may be formed to provide lateral support to structures, such as electrical connectors (for example, the electrical connectors 30 shown in FIG. 2), formed on the dies 11. The molding compound 13 may be shaped or molded using a mold. A release material may be applied to the mold to prevent the molding compound 13 from adhering to the mold. The molding compound 13 may be omitted in some cases.

As shown in FIG. 1B, a plurality of bond pads 241 is located within an active area 11A of the die 11. The active area 11A may be composed of many electric components such as active devices and passive devices on a substrate. The active area 11A contains the majority of the high density, active circuitry of the die 11. These components may be initially isolated from each other, formed on an underlying substrate, and are later interconnected together by metal interconnect lines to form the functional circuit. Typical interconnect structures include lateral interconnections, such as metal lines or wirings, and vertical interconnections, such as vias and contacts.

Bond pads 241 may be used to supply voltage signals to the circuitry within the active area 11A. These voltage signals are supplied to the bond pads 241 through a package to which the integrated circuit device is affixed. In general, after the devices are fabricated, bond pads 241 lie beneath dielectric layers and are exposed for testing and bonding to a suitable package. The electrical signals from the active area 11A are routed through the network of metal layers to one or more of the bond pads 241 which are further connected to solder bumps or other electrical connectors according to the function of the semiconductor device. An example of the above-mentioned package structure will be described in detail later with reference to FIG. 2.

Each of the dies 11 may include a seal ring structure 15 that is located in a peripheral area 11B (sometimes also called a seal ring area) adjacent to and surrounding the respective active area 11A. In some embodiments, the seal ring structure 15 is formed of conductive materials such as aluminum (Al), aluminum-copper (Al—Cu) alloy, aluminum-copper-silicon (Al—Cu—Si) alloy, or the like. The seal ring structure 15 can stop undesirable moisture and mobile ionic contaminants from reaching the circuitry within the active area 11A, thereby improving the reliability of the package structure. It should be appreciated that each of the dies 11 may also include more seal rings, with the outer seal ring encircling the inner seal ring in some embodiments, although only one seal ring of the seal ring structure 15 is illustrated in FIG. 1B.

As shown in FIG. 1B, the seal ring structure 15 in the top view has a rectangular or square shape and extends in a continuous, closed-loop ring shape. However, the configuration of the seal ring structure 15 is not limited thereto. In some other embodiments, the seal ring structure 15 has at least one slit portion (not shown) for cutting the seal ring structure 15 (i.e., it consists of intermittent portions, in the top view) in order to prevent current from being induced in the seal ring structure 15. The seal ring structure 15 may also extend in a curved or rounded shape in different embodiments. More details (such as the construction and forming steps) of the seal ring structure 15 will be described below.

Figure 2:
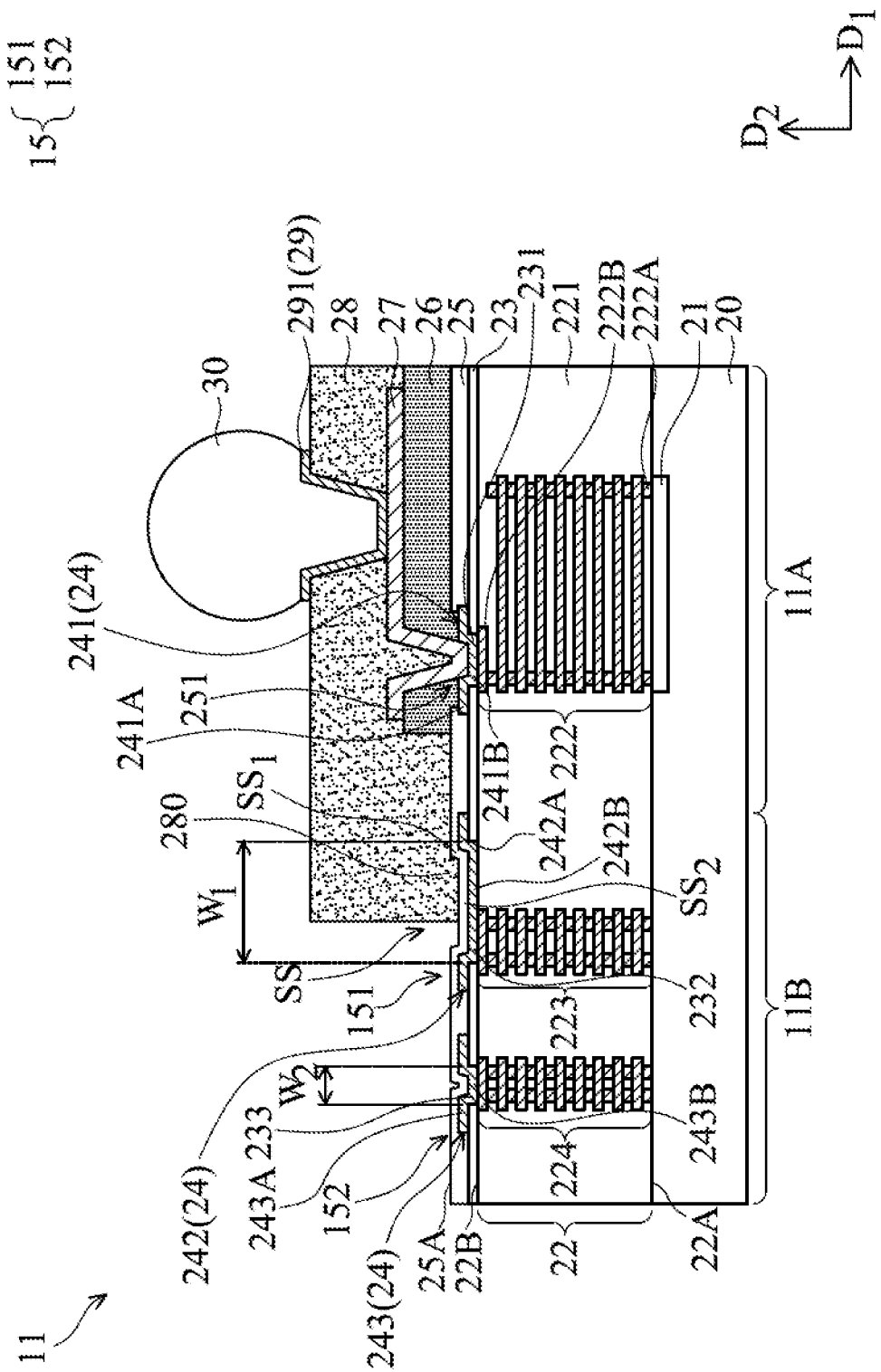
FIG. 2 is a cross-sectional view of a portion of a WLP structure, in accordance with some embodiments.

FIG. 2 is a cross-sectional view of a portion of a WLP structure (i.e., a die 11), in accordance with some embodiments. The WLP structure has an active area 11A and a peripheral area 11B surrounding the active area 11A, as described above. In FIG. 2, the WLP structure includes a substrate 20. The substrate 20 is a semiconductor substrate, which may be a bulk semiconductor substrate, a silicon-on-insulator (SOI) substrate, a germanium-on-insulator (GOI) substrate, or the like. The semiconductor materials of the substrate 20 may include silicon, germanium; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 20 may be doped or undoped. Other substrates, such as multi-layered or gradient substrates, may also be used.

Devices 21 (for simplicity, one device 21 is depicted) such as active devices or passive devices are formed within the active area 11A on the substrate 20, in accordance with some embodiments. As one of ordinary skill in the art will recognize, various active devices and passive devices such as transistors, diodes, capacitors, resistors, inductors and the like may be used to generate the desired structural and functional design for the die 11. The devices 21 may be formed within or on the surface of the substrate 20 using any suitable processes. In some alternative embodiments, the substrate 20 may be an interposer substrate or a package substrate, which is substantially free from integrated circuit devices therein.

In accordance with some embodiments, an interconnect structure 22 is formed over the substrate 20, and is electrically coupled to the devices 21, as shown in FIG. 2. The interconnect structure 22 has opposite surfaces 22A and 22B, and the surface 22A faces and directly contacts the substrate 20. The interconnect structure 22 includes multiple laminated insulating layers 221 and multiple conductive layers 222 surrounded by the insulating layers 221.

The conductive layers 222 may include conductive lines providing electrical connection in horizontal directions and conductive vias providing electrical connection in vertical directions. Also, the conductive layers 222 include contacts 222A exposed from the surface 22A and in direct contact with the devices 21, and contacts 222B (for simplicity, one contact 222B is depicted) exposed from the surface 22B for connection with the subsequently formed bonding pads. The devices 21 are interconnected together by one or more of the conductive layers 222 to form the desired functional circuit for the die 11.

The materials of the insulating layers 221 may include silicon dioxide, undoped silicate glass (USG), phosphosilicate glass (PSG), or the like, although other suitable insulating materials may also be used. In accordance with some embodiments, the materials used to form the insulating layers 221 is photosensitive. A photolithography process may therefore be used to form openings with desired patterns in the insulating layers 221. The materials of the conductive layers 222 may include copper (Cu), aluminum (Al), tungsten (W), cobalt (Co), other metal or metal alloy, although other suitable conductive materials may also be used.

The formation of the interconnect structure 22 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a damascene process, a dual damascene process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

A passivation layer 23 is further formed over the substrate 20, in accordance with some embodiments. In some embodiments, the passivation layer 23 is formed on the surface 22B of the interconnect structure 22, and is patterned to form openings 231 (for simplicity, one opening 231 is depicted) to partially expose the underlying contacts 222B, as shown in FIG. 2. The passivation layer 23 may be made of or include silicon nitride (SiN), silicon dioxide (SiO$_2$), silicon oxynitride (SiON), polyimide (PI), benzocyclobutene (BCB), polybenzoxazole (PBO), or other suitable insulating material, and may be formed using a deposition process, such as CVD process. Openings 231 in the passivation layer 23 may be made by removing a portion of the passivation layer 23 using a mask-defined photoresist etching process.

A metallization layer 24 is conformally formed on the passivation layer 23, in accordance with some embodiments. In some embodiments, the metallization layer 24 includes multiple metallization pads 241 (for simplicity, one first metallization pad 241 is depicted) each including multiple (for example, two) parts 241A over the passivation layer 23 and a part 241B located between the parts 241A and extending into one opening 231 of the passivation layer 23, as shown in FIG. 2. The metallization pads 241 are in direct contact with the contacts 222B through the openings 231, and interconnected to the devices 21 by the conductive layers 222 of the interconnect structure 22. The metallization pads 241 may be used to supply voltage signals to the devices 21, and are sometimes also referred to as the bond pads 241.

The metallization layer 24 (and the metallization pads 241) may be made of or include aluminum (Al), copper (Cu), tin (Sn), nickel (Ni), gold (Au), silver (Ag), or other suitable metal material. The metallization pads 241 may be formed using a deposition process, such as electroplating process, to form a metallization layer (i.e., the metallization layer 24) on the passivation layer 23 and in the openings 231 thereof, and portions of the metallization layer over the passivation layer 23 may then be removed through a suitable process (such as photolithography masking and etching) to form the metallization pads 241. However, any other suitable process may be utilized to form the metallization pads 241.

As shown in FIG. 2, a passivation layer 25 is conformally formed on the passivation layer 23 and the metallization layer 24, in accordance with some embodiments. In some embodiments, a patterning process is further performed on the passivation layer 25 to form openings 251 (for simplicity, one opening 251 is depicted) to partially expose the underlying metallization pads 241, which will be further connected to the subsequently formed electrical connectors. The materials and formation method of the passivation layer 25 may be the same as or similar to those of the passivation layer 23, and are not repeated herein. The top surface 25A of the formed passivation layer 25 is substantially parallel to the surface 22B of the underlying interconnect structure 22, as shown in FIG. 2.

In accordance with some embodiments, the WLP also includes a (dual) seal ring structure 15 including an inner seal ring 151 and an outer seal ring 152 encircling the inner seal ring 151, formed within the peripheral area 11B of the die 11, as shown in FIG. 2. The outer seal ring 152 may be used to protect the inner seal ring 151, while the outer seal ring 152 may be omitted in some cases. The configuration (in the top view) of the inner seal ring 151 and the outer seal ring 152 may be the same as or similar to that of the seal ring structure 15 illustrated in FIG. 1B.

To protect the devices 21 and the circuitry (including the conductive layers 222 and the metallization pads 241) within the active area 11A of the die 11, the seal ring structure 15 is arranged to surround the active area 11A and extend from the top surface of the substrate 20 on which the devices 21 are affixed to the same level as the metallization pads 241, in accordance with some embodiments.

For example, in FIG. 2, the inner seal ring 151 of the seal ring structure 15 includes multiple stacked conductive layers 223 within the interconnect structure 22 and a metallization pad 242 (also called a seal ring pad 242) on the passivation layer 23. The structure of the conductive layers 223 may be the same as or similar to those of the conductive layers 222 previously described, but the conductive layers 223 (as well as the entire inner seal ring 151) are insulated from the devices 21.

The metallization pad 242 separated from the metallization pads 241 includes multiple (for example, two) parts 242A over the passivation layer 23 and a part 242B located between the parts 242A and extending into an opening 232 of the passivation layer 23. The part 242B of the metallization pad 242 is in direct contact with the top (such as a contact) of the conductive layers 223 through the opening 232. The opening 232 is formed in the passivation layer 23 before forming the metallization pad 242 over the passivation layer 23, in accordance with some embodiments. The formation method of the opening 232 may be the same as or similar to that of the openings 231. In some embodiments, the opening 232 and the openings 231 are formed in the same step. The materials and formation method (for example, by patterning the metallization layer 24) of the metallization pad 242 may be the same as or similar to those of the metallization pads 241. In some embodiments, the metallization pad 242 and the metallization pads 241 are formed in the same step.

Similarly, the outer seal ring 152 of the seal ring structure 15 consists of multiple stacked conductive layers 224 within the interconnect structure 22 and a metallization pad 243 (also called a seal ring pad 243) on the passivation layer 23, as shown in FIG. 2. The structure of the conductive layers 224 may be the same as or similar to those of the conductive layers 222 previously described, but the conductive layers 224 (as well as the entire outer seal ring 152) are insulated from the devices 21.

The metallization pad 243 separated from the metallization pads 241 and the metallization pad 242 includes multiple (for example, two) parts 243A over the passivation layer 23 and a part 243B located between the parts 243A and extending into an opening 233 of the passivation layer 23. The part 243B of the metallization pad 243 is in direct contact with the top (such as a contact) of the conductive layers 224 through the opening 233. The opening 233 is formed in the passivation layer 23 before forming the metallization pad 243 over the passivation layer 23, in accordance with some embodiments. The formation method of the opening 233 may be the same as or similar to that of the openings 231. In some embodiments, the opening 233, the opening 232, and the openings 231 are formed in the same step. The materials and formation method (for example, by patterning the metallization layer 24) of the metallization pad 243 may also be the same as or similar to those of the metallization pads 241. In some embodiments, the metallization pad 243, the metallization pad 242, and the metallization pads 241 are formed in the same step.

As shown in FIG. 2, the width $W_1$ of the part 242B of the metallization pad 242 (equal to the width of the opening 232 of the passivation layer 23) in a horizontal direction $D_1$ substantially parallel to the top surface 25A of the passivation layer 25 is greater than the width $W_2$ of the part 243B of the metallization pad 243 (equal to the width of the opening 233 of the passivation layer 23) in the horizontal direction $D_1$, in accordance with some embodiments. In some embodiments, the width $W_1$ may be about twice the width $W_2$. For example, the width $W_2$ is about 2 μm and the width $W_1$ is about 4 μm. However, other suitable values can also be used.

Accordingly, a step structure SS is formed on the top surface 25A of the passivation layer 25, and corresponds to the underlying metallization pad 242 having a step structure (consisting the parts 242A on the passivation layer 23 and the part 242B recessed in the passivation layer 23). In accordance with some embodiments, the step structure SS includes multiple (for example, two) higher parts $SS_1$ over and corresponding to the parts 242A of the metallization pad 242, and a lower part $SS_2$ (lower than the higher parts $SS_1$ in a vertical direction $D_2$ perpendicular to the horizontal direction $D_1$) over and corresponding to the part 242B of the metallization pad 242, as shown in FIG. 2. The lower part $SS_2$ has a recess structure.

As described above, since the metallization pad 242 (especially for the part 242B) has a greater width, a wider step structure SS (because the lower part $SS_2$ has a greater width) is implemented over the metallization pad 242 accordingly. The step structure SS facilitates the stable landing of the subsequent polymer layer over the passivation layer 25, which will be described further below.

In accordance with some embodiments, the WLP structure further includes a polymer layer 26 on the passivation layer 25 and partially exposing the metallization pads 241 (i.e., bond pads 241), as shown in FIG. 2. In some embodiment, the polymer layer 26 is formed over the active area 11A, and stops before the peripheral area 11B. The polymer layer 26 may be made of or include a polymer, such as an epoxy, polyimide, benzocyclobutene (BCB), polybenzoxazole (PBO), and the like, although other relatively soft, often organic, dielectric materials can also be used. The formation methods include spin coating or other methods. The openings of the polymer layer 26 for exposing the metallization pads 241 may be made by removing a portion of the polymer layer 26 using a mask-defined photoresist etching process.

The WLP structure further includes a post-passivation interconnect (PPI) layer 27 above the polymer layer 26 and in contact with the metallization pads 241, in accordance with some embodiments. The PPI layer 27 may also be called a redistribution layer as well. The PPI layer 27 may be made of or include aluminum (Al), copper (Cu), a Cu alloy, or other suitable metal material, and may be formed by an electroplating process, an electroless process, a damascene process, a dual damascene process, a sputter process, a PVD process or the like, or a combination thereof. It should be appreciated that the WLP structure may also include a number of PPI layers 27 to form a network of inter-level interconnects which may electrically connect to the metallization pads 241 according to the function of the die 11.

The WLP structure further includes a polymer layer 28 on the polymer layer 26, the PPI layer 27, and the passivation layer 25, in accordance with some embodiments. In some embodiments, the polymer layer 28 is formed over the active area 11A, and extends into the peripheral area 11B to cover the step structure SS over the metallization pad 242 of the inner seal ring 151. In some embodiments, the polymer layer 28 stops before the portion of the passivation layer 25 over the metallization pad 243 of the outer seal ring 152. The materials and formation method polymer layer 28 may be the same as or similar to those of the polymer layer 26, and are not repeated herein.

As described above, the step structure SS (especially for the lower part $SS_2$) has a greater width, and thus a portion (i.e., the peripheral portion 280) of the polymer layer 28 under the periphery thereof can extend into the lower part $SS_2$ of the step structure SS to engage with the step structure SS (it should be appreciated that the peripheral portion 280 is illustrated to fill a portion of the lower part $SS_2$, although it may also fill the entire lower part $SS_2$). As a result, adhesion between the polymer layer 28 and the passivation layer 25 is improved, thereby reducing the risk of delamination of the polymer layer 28. Accordingly, the reliability of the entire package structure is improved.

In accordance with some embodiments, as shown in FIG. 2, the polymer layer 28 also forms openings to expose a portion of the underlying PPI layer 27. The WLP structure further includes an under bump metallization (UBM) layer 29 formed on the polymer layer 28 and in contact with the PPI layer 27 through the openings of the polymer layer 28. The under bump metallization (UBM) layer 29 may be patterned (using a mask-defined photoresist etching process, for example) to form separate UBM elements 291. A number of electrical connectors 30 (such as solder balls) are formed on and electrically connected to the UBM elements 291.

The electrical connectors 30 are interconnected to the metallization pads 241 through the under bump metallization elements 291 and the PPI layer 27. The electrical connectors 30 allow the fabricated package structure to be further connected to an external electric component such as a printed circuit board (PCB).

Figure 3:
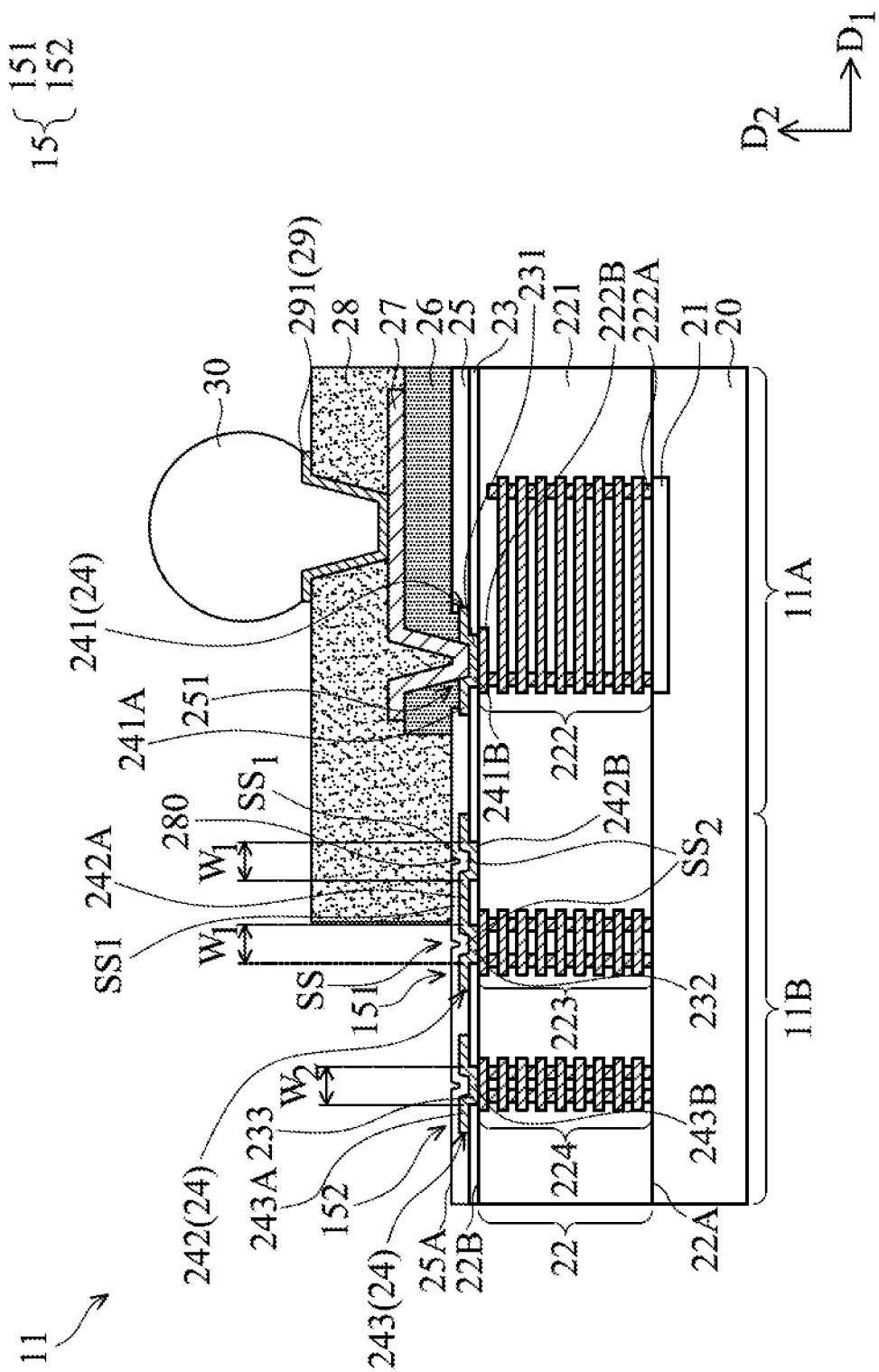
FIG. 3 is a cross-sectional view of a portion of a WLP structure, in accordance with some embodiments.

FIG. 3 is a cross-sectional view of a portion of a WLP structure (i.e., a die 11), in accordance with some embodiments. It should be appreciated that most of the structures in FIG. 3 are the same as those in FIG. 2, so only the different parts are described here. In FIG. 3, the metallization pad 242 (of the inner seal ring 151) includes multiple (for example, three) parts 242A over the passivation layer 23 and multiple (for example, two) parts 242B located between the parts 242A and extending into multiple (for example, two) openings 232 of the passivation layer 23. Each of the parts 242B is located between two parts 242A, and a middle part 242A is located between two parts 242B in some embodiments.

The openings 232 are formed in the passivation layer 23 before forming the metallization pad 242. In some embodiments, one opening 231 is directly above the top contact of the conductive layers 223, and the other opening 231 is offset with respect to the top contact. Also, one part 242B of the metallization pad 242 is directly above the top contact of the conductive layers 223, and the other part 242B is offset with respect to the top contact.

As shown in FIG. 3, the width $W_1$ of the parts 242B of the metallization pad 242 (equal to the width of the openings 232 of the passivation layer 23) in the horizontal direction $D_1$ is the same, and the width $W_1$ may be equal to or greater than the width $W_2$ of the part 243B of the metallization pad 243 (equal to the width of the opening 233 of the passivation layer 23) in the horizontal direction $D_1$. In some other embodiments, the parts 242B of the metallization pad 242 (as well as the openings 232 of the passivation layer 23) may have different widths, and the width $W_1$ of each of the parts 242B may be equal to or greater than the width $W_2$ of the part 243B of the metallization pad 243 (equal to the width of the opening 233 of the passivation layer 23) in the horizontal direction $D_1$.

The passivation layer 25 is conformally formed on the metallization pad 242 having a step structure (consisting of the parts 242A on the passivation layer 23 and the parts 242B recessed in the passivation layer 23), and a step structure SS is therefore formed on the top surface 25A of the passivation layer 25. In accordance with some embodiments, the step structure SS includes multiple (for example, three) higher parts $SS_1$ over and corresponding to the parts 242A of the metallization pad 242, and multiple (for example, two) lower part $SS_2$ (lower than the higher parts $SS_1$ in the vertical direction $D_2$) over and corresponding to the parts 242B of the metallization pad 242, as shown in FIG. 3. The width of each of the lower part $SS_2$ in the horizontal direction $D_1$ may be determined according the width $W_1$ of the respective part 242B.

As described above, since the parts 242B of the metallization pad 242 have a greater width and/or the number of parts 242B is increased (to two or more than two, in some cases), a wider step structure SS is implemented over the metallization pad 242 accordingly. As such, the peripheral portion 280 of the polymer layer 28 over the passivation layer 25 can extend into one or more of the lower parts $SS_2$ of the step structure SS to engage with the step structure SS (it should be appreciated that the peripheral portion 280 is illustrated to fill one of the lower parts $SS_2$, although it may fill multiple lower parts $SS_2$). As a result, adhesion between the polymer layer 28 and the passivation layer 25 is improved, thereby reducing the risk of delamination of the polymer layer 28. Accordingly, the reliability of the entire package structure is also improved.

Figure 4:
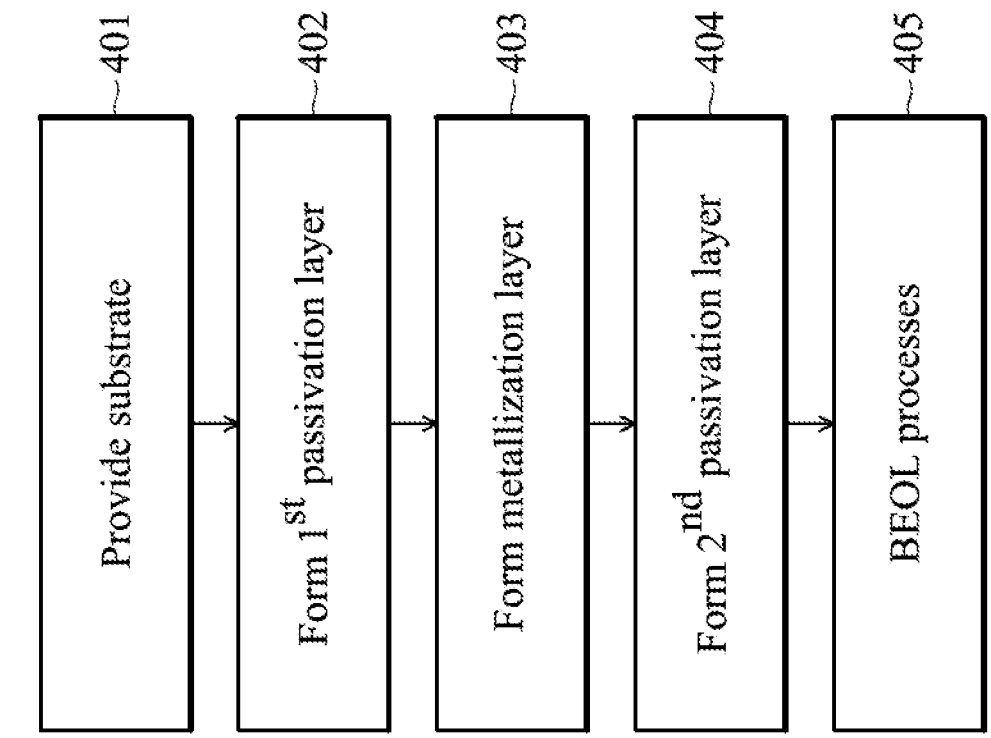
FIG. 4 is a simplified flowchart of a method of forming a WLP structure, in accordance with some embodiments.

FIG. 4 is a simplified flowchart of a method 400 of forming a WLP structure (such as the WLP structure in FIG. 2 or FIG. 3), in accordance with some embodiments. For illustration, the flow chart will be described along with the drawings shown in FIGS. 2 and 3. Some of the described operations can be replaced or eliminated in different embodiments. Alternatively, some operations may be added in different embodiments.

The method 400 includes operation 401, in which a substrate 20 is provided. In some embodiments, the substrate 20 has multiple devices 21 such as active devices and passive devices formed therein. In some embodiments, an interconnect structure 22 is formed on the substrate 20 and electrically coupled to the devices 21. For details of the interconnect structure 22, reference may be made to the description of FIG. 2.

The method 400 further includes operation 402, in which a (first) passivation layer 23 (sometimes called a bottom passivation layer) is formed over the substrate 20. In some embodiments, the passivation layer 23 is formed on the interconnect structure 22 over the substrate 20. In some embodiments, a patterning process (such as a mask-defined photoresist etching process) is performed on the passivation layer 23 to simultaneously form multiple openings 231, 232, and 233 for receiving the subsequently formed bond pads 241 and seal ring pads 242 and 243, respectively. In some embodiments, the width $W_1$ of the opening 232 for the seal ring pad 242 (closer to the bond pads 241) is greater than the width $W_2$ of the opening 233 for the seal ring pad 243 (farther away from the bond pads 241). Additionally or alternatively, there may be two or more opening(s) 232 for the seal ring pad 242.

The method 400 further includes operation 403, in which a metallization layer 24 is conformally formed on the passivation layer 23. In some embodiments, a portion of the metallization layer 24 extends into the openings 231, 232, and 233 of the passivation layer 23. In some embodiments, a patterning process (such as a mask-defined photoresist etching process) is performed on the metallization layer 24 to simultaneously form the bond pads 241 and the seal ring pads 242 and 243.

The method 400 further includes operation 404, in which a (second) passivation layer 25 (sometimes called a top passivation layer) is conformally formed on the passivation layer 23 and the patterned metallization layer 24 (including the bond pads 241 and the seal ring pads 242 and 243). In some embodiments, a step structure SS is formed on the top surface 25A of the passivation layer 25, and corresponds to the seal ring pad 242 having a step structure (see FIGS. 2-3). In some embodiments, the step structure SS includes multiple higher parts $SS_1$ and one or more lower parts (recesses) $SS_2$, which conform to the topography of the underlying seal ring pad 242.

The method 400 further includes operation 405, in which back-end-of-line (BEOL) processes are performed, including forming and patterning a polymer layer 26, a PPI layer 27, a polymer layer 28, and an UBM layer 29 over the passivation layer 25, and then mounting a number of electrical connectors 30 (such as solder balls) on the patterned UBM layer 29, as shown in FIG. 2. In some embodiments, the polymer layer 28 extends to partially cover the step structure SS of the passivation layer 25, and the peripheral portion 280 of the polymer layer 28 extends into one or more of the lower parts (recesses) SS2 to engage with the step structure SS, thereby improving the anchorage of the polymer layer 28 on the passivation layer 25. After the BEOL processes are complete, a die cutting or singulation process is performed using a mechanical or laser saw to singulate individual dies 11 from the wafer 12 (in FIG. 1), in accordance with some embodiments.

Embodiments of the disclosure form a WLP structure having a polymer layer delamination prevention design. In accordance with some embodiment, the polymer layer delamination prevention design is to form a step structure on the top surface of the top passivation layer by increasing the number of openings in the bottom passivation layer and/or increasing the width of these openings. The topography of the step structure has a height difference (i.e., non-flat) that conforms to the topography of the underlying layer(s), so the polymer layer landing on the top passivation layer can better engage with the step structure. Accordingly, the risk of delamination of the polymer layer is reduced, and the reliability of the package structure is improved.

In accordance with some embodiments, a package structure is provided. The package structure includes a substrate, a first passivation layer, a metallization layer, a second passivation layer, and a polymer layer. The first passivation layer is formed over the substrate. The metallization layer is conformally formed on the first passivation layer. The second passivation layer is conformally formed on the first passivation layer and the metallization layer. A step structure is formed on the top surface of the second passivation layer, and includes at least one lower part that is lower than the other parts of the step structure The polymer layer is formed over the second passivation layer. A portion of the polymer layer extends into one lower part of the step structure to engage with the step structure.

In accordance with some embodiments, a package structure is provided. The package structure includes a substrate, a first passivation layer, a metallization layer, a second passivation layer, and a polymer layer. The first passivation layer is formed over the substrate. The metallization layer is formed over the first passivation layer. At least one portion of the metallization layer extends into the first passivation layer. The second passivation layer is conformally formed on the first passivation layer and the metallization layer. A step structure is formed on the top surface of the second passivation layer, and includes at least one lower part that is lower than the other parts of the step structure. The lower part of the step structure corresponds to the portion of the metallization layer in the first passivation layer. The polymer layer is formed over the second passivation layer, and the peripheral portion of the polymer layer extends into the lower part of the step structure.

In accordance with some embodiments, a method of forming a package structure is provided. The method includes forming a first passivation layer over a substrate. The method further includes forming a metallization layer conformally on the first passivation layer. The method also includes forming a second passivation layer conformally on the first passivation layer and the metallization layer, so that a step structure is formed on the top surface of the second passivation layer. The step structure has at least one lower part that is lower than the other parts of the step structure. In addition, the method includes forming a polymer layer over the second passivation layer, and the peripheral portion of the polymer layer extends into the lower part of the step structure to engage with the step structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a substrate;
   a first passivation layer formed over the substrate;
   a metallization layer conformally formed on the first passivation layer, and a portion of the metallization layer extends into the first passivation layer;
   a second passivation layer conformally formed on the first passivation layer and the metallization layer, wherein a step structure is formed on a top surface of the second passivation layer, and the step structure includes at least one lower part that is recessed from the top surface and lower than other parts of the step structure, wherein the at least one lower part is vertically aligned with the portion of the metallization layer; and
   a polymer layer formed over the second passivation layer, wherein a portion of the polymer layer extends into the at least one lower part of the step structure to engage with the step structure.

2. The package structure as claimed in claim 1, wherein the portion of the polymer layer engaging with the step structure is located under a periphery of the polymer layer.

3. The package structure as claimed in claim 1, wherein the metallization layer comprises a first metallization pad, and the first metallization pad includes a plurality of first parts over the first passivation layer and a second part located between the first parts and extending into the first passivation layer, and
   wherein the step structure includes a plurality of higher parts and a lower part located between and lower than the higher parts, and
   wherein positions of the higher parts correspond to positions of the first parts of the first metallization pad, and a position of the lower part corresponds to a position of the second part of the first metallization pad.

4. The package structure as claimed in claim 3, wherein a device is placed on the substrate, and the metallization layer further comprises a second metallization pad covered by the polymer layer and separated from the first metallization pad, and
   wherein the second metallization pad is electrically coupled to the device, and the first metallization pad is insulated from the device.

5. The package structure as claimed in claim 3, wherein the metallization layer further comprises a second metallization pad farther from the polymer layer than the first metallization pad, and the second metallization pad includes a plurality of third parts over the first passivation layer and a fourth part located between the third parts and extending into the first passivation layer, and
wherein a width of the second part of the first metallization pad is greater than a width of the fourth part of the second metallization pad in a horizontal direction parallel to the top surface of the second passivation layer.

6. The package structure as claimed in claim 3, wherein the first metallization pad further includes a plurality of second parts located between the first parts and extending into the first passivation layer, and
wherein the step structure further includes a plurality of lower parts located between and lower than the higher parts, and
wherein positions of the higher parts correspond to positions of the first parts of the first metallization pad, and positions of the lower parts correspond to positions of the second parts of the first metallization pad.

7. The package structure as claimed in claim 6, wherein one of the first parts is located between two of the second parts, and one of the higher parts is located between two of the lower parts.

8. The package structure as claimed in claim 6, wherein the metallization layer further comprises a second metallization pad farther from the polymer layer than the first metallization pad, and the second metallization pad includes a plurality of third parts over the first passivation layer and a fourth part located between the third parts and extending into the first passivation layer, and
wherein a width of each of the second parts of the first metallization pad is equal to or greater than a width of the fourth part of the second metallization pad in a horizontal direction parallel to the top surface of the second passivation layer.

9. The package structure as claimed in claim 8, wherein the second parts of the first metallization pad have the same width.

10. The package structure as claimed in claim 6, wherein the portion of the polymer layer engaging with the step structure extends into one of the lower parts closest to the polymer.

11. A package structure, comprising:
a substrate;
a first passivation layer formed over the substrate;
a metallization layer formed over the first passivation layer, and at least one portion of the metallization layer extends into the first passivation layer;
a second passivation layer conformally formed on the first passivation layer and the metallization layer, wherein a step structure is formed on a top surface of the second passivation layer, and the step structure includes at least one lower part that is recessed from the top surface and lower than other parts of the step structure, wherein the at least one lower part of the step structure corresponds to the at least one portion of the metallization layer in the first passivation layer in a vertical direction substantially perpendicular to the top surface of the second passivation layer; and
a polymer layer formed over the second passivation layer, wherein a peripheral portion of the polymer layer extends into the at least one lower part of the step structure.

12. The package structure as claimed in claim 11, wherein the metallization layer comprises:
a first metallization pad, wherein the first metallization pad has a plurality of first parts over the first passivation layer and a second part located between the first parts and extending into the first passivation layer, and
wherein the step structure includes a plurality of higher parts and a lower part located between and lower than the higher parts, wherein positions of the higher parts correspond to positions of the first parts of the first metallization pad, and a position of the lower part corresponds to a position of the second part of the first metallization pad; and
a second metallization pad, wherein the second metallization pad is farther from the polymer layer than the first metallization pad, and the second metallization pad has a plurality of third parts over the first passivation layer and a fourth part located between the third parts and extending into the first passivation layer, and
wherein a width of the second part of the first metallization pad is greater than a width of the fourth part of the second metallization pad in a horizontal direction parallel to the top surface of the second passivation layer.

13. The package structure as claimed in claim 12, wherein the metallization layer further comprises:
a third metallization pad, wherein the third metallization pad is located below the polymer layer and separated from the first metallization pad and the second metallization pad, and
wherein the package structure further comprises a device located in a first area of the substrate, and the third metallization pad is electrically coupled to the device, and
wherein the first metallization pad and the second metallization pad are located in a second area surrounding the first area.

14. The package structure as claimed in claim 11, wherein the metallization layer comprises:
a first metallization pad, wherein the first metallization pad has a plurality of first parts over the first passivation layer and a plurality of second parts located between the first parts and extending into the first passivation layer, and wherein the step structure includes a plurality of higher parts and a plurality of lower parts located between and lower than the higher parts, wherein positions of the higher parts correspond to positions of the first parts of the first metallization pad, and positions of the lower parts corresponds to positions of the second parts of the first metallization pad; and
a second metallization pad, wherein the second metallization pad is farther from the polymer layer than the first metallization pad, and the second metallization pad has a plurality of third parts over the first passivation layer and a fourth part located between the third parts and extending into the first passivation layer.

15. The package structure as claimed in claim 14, wherein in a horizontal direction parallel to the top surface of the second passivation layer, the second parts of the first metallization pad have different widths, and the lower parts of the step structure have different widths.

16. A method of forming a package structure, comprising:
forming a first passivation layer over a substrate;
patterning the first passivation layer to form at least one first opening in the first passivation layer;
forming a metallization layer conformally on the first passivation layer, comprising:
forming a first metallization pad conformally on the first passivation layer, and the first metallization pad has at least one first part extending into the at least one first opening;
forming a second passivation layer conformally on the first passivation layer and the metallization layer, so that a step structure is formed on a top surface of the second passivation layer, wherein the step structure has at least one lower part that is lower than other parts of the step structure, and the at least one lower part of the step structure corresponds to the at least one first part of the first metallization pad; and forming a polymer layer over the second passivation layer, wherein a peripheral portion of the polymer layer extends into the at least one lower part of the step structure to engage with the step structure.

17. The method as claimed in claim 16, wherein the at least one first opening of the first passivation layer comprises a plurality of first openings separated from each other, the at least one first part of the first metallization pad comprises a plurality of first parts, and the at least one lower part of the step structure comprises a plurality of lower parts, and wherein positions of the lower parts correspond to positions of the first openings and positions of the first parts.

18. The method as claimed in claim 17, wherein the peripheral portion of the polymer layer extends into one or more of the lower parts, after the formation of the polymer layer.

19. The method as claimed in claim 16, further comprising:

patterning the first passivation layer to form a second opening in the first passivation layer before the formation of the metallization layer, and wherein the metallization layer forming step further comprises forming a second metallization pad conformally on the first passivation layer, and the second metallization pad has a second part extending into the second opening, and wherein the second metallization pad is farther from the polymer layer than the first metallization pad, after the formation of the polymer layer, and a width of the at least one first part of the first metallization pad is greater than a width of the second part of the second metallization pad in a horizontal direction parallel to the top surface of the second passivation layer.

20. The package structure as claimed in claim 4, further comprising:

a second polymer layer formed between the second passivation layer and the polymer layer, wherein the second polymer layer partially exposes the second metallization pad, wherein a sidewall of the second polymer layer is laterally separated from the first metallization pad;

an interconnect layer formed on the second polymer layer and extending into the second polymer layer to contact the second metallization pad;

an under bump metallization layer formed on the polymer layer and extending into the polymer layer to contact the interconnect layer; and an electrical connector formed on the under bump metallization layer.

* * * * *